United States Patent
Plesniak et al.

(10) Patent No.: US 8,816,195 B1
(45) Date of Patent: Aug. 26, 2014

(54) LIGHT SHIELD FOR SOLAR CONCENTRATORS

(75) Inventors: Adam P. Plesniak, Huntington Beach, CA (US); Guy L. Martins, Downey, CA (US)

(73) Assignee: The Boeing Company, Chicago, IL (US)

( * ) Notice: Subject to any disclaimer, the term of this patent is extended or adjusted under 35 U.S.C. 154(b) by 128 days.

(21) Appl. No.: 12/479,136

(22) Filed: Jun. 5, 2009

(51) Int. Cl.
*H02N 6/00* (2006.01)
*H01L 31/00* (2006.01)

(52) U.S. Cl.
USPC .......................... 136/259; 136/251; 136/246

(58) Field of Classification Search
CPC . Y02E 10/52; H01L 31/0232; H01L 31/0522; H01L 31/0524
USPC .............................. 136/246, 259, 252; 257/98
See application file for complete search history.

(56) References Cited

U.S. PATENT DOCUMENTS

| | | | | |
|---|---|---|---|---|
| 4,194,213 A | * | 3/1980 | Kano et al. | 257/159 |
| 4,830,678 A | * | 5/1989 | Todorof et al. | 136/259 |
| 5,096,505 A | * | 3/1992 | Fraas et al. | 136/246 |
| 5,249,901 A | * | 10/1993 | Moore | 411/182 |
| 6,226,882 B1 | * | 5/2001 | Barr | 33/528 |
| 2009/0107541 A1 | * | 4/2009 | Linke et al. | 136/246 |

FOREIGN PATENT DOCUMENTS

| | | | |
|---|---|---|---|
| EP | 2077586 A1 | * | 7/2009 |
| WO | WO 2008050392 A1 | * | 5/2008 |

* cited by examiner

*Primary Examiner* — Jennifer Michener
*Assistant Examiner* — Marla D McConnell
(74) *Attorney, Agent, or Firm* — Diane M. Tsuda

(57) ABSTRACT

A solar receiver unit including a housing defining a recess, a cell assembly received in the recess, the cell assembly including a solar cell, and a light shield received in the recess and including a body and at least two tabs, the body defining a window therein, the tabs extending outward from the body and being engaged with the recess, wherein the window is aligned with the solar cell.

18 Claims, 6 Drawing Sheets

LIGHT SHIELD FOR SOLAR CONCENTRATORS

STATEMENT

This invention was made with Government support under DE-FC36-07GO17052 awarded by the Department of Energy. The government of the United States of America has certain rights in this invention.

FIELD

The present patent application relates to solar concentrators and, more particularly, to light shields for solar concentrators.

BACKGROUND

Photovoltaic solar concentrators generate electrical power by concentrating incoming sunlight onto photovoltaic devices using various optical elements, thereby collecting sunlight from a large area and concentrating it on a relatively small target area. Therefore, high efficiency solar cells, such as gallium arsenide-based ("GaAs") solar cells, may be used in such solar concentrator systems in place of less efficient (and less expensive) silicon solar cells, thereby producing more energy per unit area at a reduced cost.

However, concentrated solar energy presents additional obstacles over traditional solar energy systems. For example, during off-point testing of solar concentrator systems (i.e., tests in which incoming light does not fall directly onto the target solar cell), the concentrated solar energy may fall onto areas adjacent to the target solar cells. These adjacent areas include important electrical and mechanical components, such as insulated wires, bypass diodes, adhesives and the like, which may quickly degrade or be damaged upon exposure to concentrated solar energy. Furthermore, thermal gradients in these components may damage the adjacent optical elements.

Accordingly, those skilled in the art continue to seek improvements in the field of solar concentrators.

SUMMARY

In one aspect, the disclosed solar receiver unit may include a housing defining a recess, a cell assembly received in the recess, the cell assembly including a solar cell, and a light shield received in the recess and including a body and at least two tabs, the body defining a window therein, the tabs extending outward from the body and being engaged with the recess, wherein the window is aligned with the solar cell.

In another aspect, the disclosed solar receiver unit may include a housing defining a recess, a cell assembly received in the recess, the cell assembly including a solar cell, a light shield received in the recess and including a body and at least two tabs, the body defining a window therein, the tabs extending outward from the body and being engaged with the recess to define an interference fit therebetween, and an optical element positioned over the light shield such that the light shield is disposed between the cell assembly and the optical element, the optical element including a guide that extends through the window and is aligned with the solar cell.

Other aspects of the disclosed light shield for solar concentrators and associated solar receiver units will become apparent from the following description, the accompanying drawings and the appended claims.

DETAILED DESCRIPTION

Figure 1:
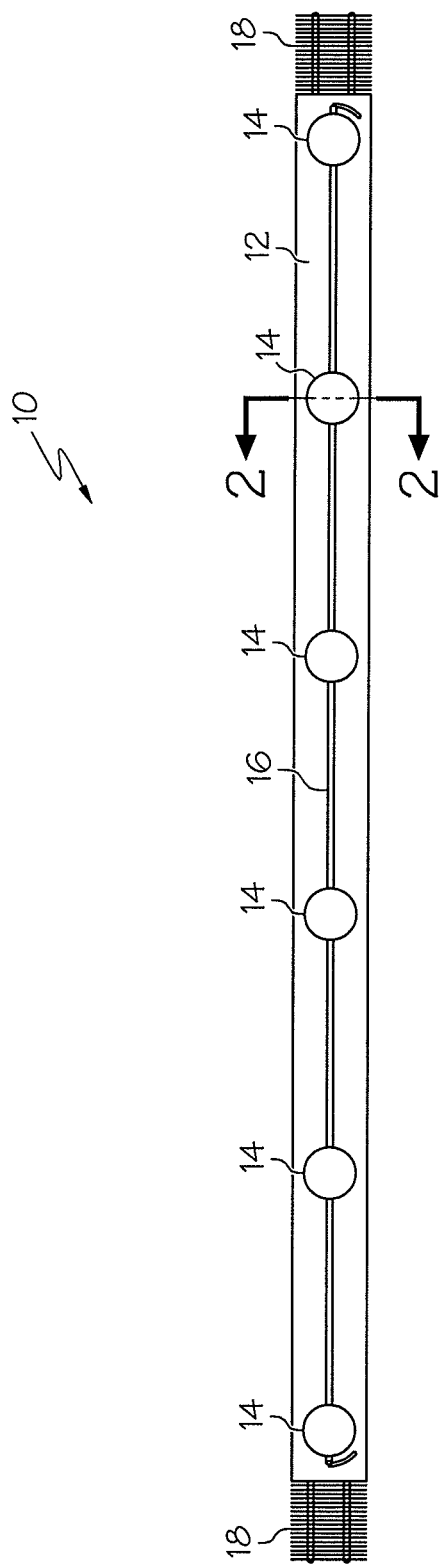
FIG. 1 is a top plan view of a solar receiver assembly in accordance with one aspect of the present disclosure.

In one aspect, a solar concentrator may include the receiver assembly 10 shown in FIG. 1. The receiver assembly 10 may receive incoming sunlight and may convert (or facilitate the conversion of) the incoming sunlight into electrical energy. While not shown in the drawings, the receiver assembly 10 may be secured to a support structure or may be received in a housing, as is known in the art. While also not shown in the drawings, primary optical elements, such as mirrors (e.g., parabolic mirrors) or the like, may direct incoming sunlight to the receiver assembly 10, as is known in the art.

The receiver assembly 10 may include a housing 12 that supports receiver units 14. While six receiver units 14 are shown in FIG. 1, those skilled in the art will appreciate that the housing 12 may support one or any number of receiver units 14 without departing from the scope of the present disclosure. The receiver units 14 may be electrically coupled to a central unit (e.g., a load, a batter or a collector) by way of a bus strip 16.

Figure 4:
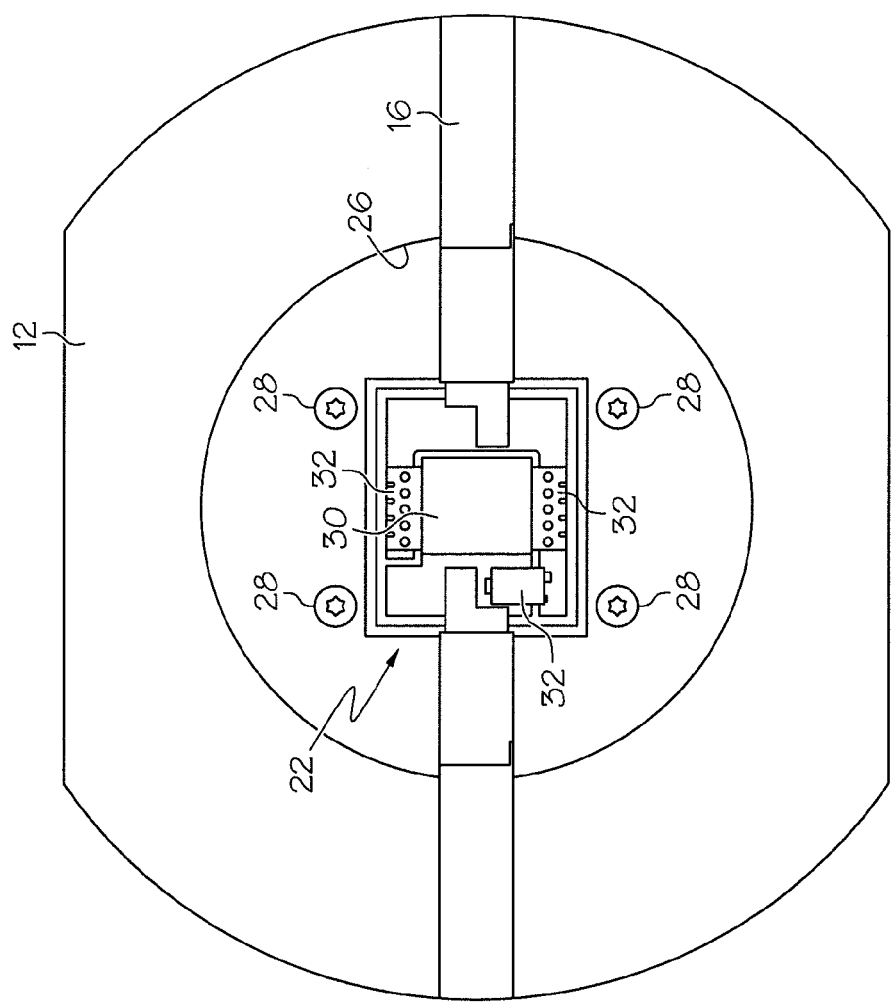
FIG. 4 is a top plan view of the receiver unit of FIG. 3, shown with the light shield removed.

Still referring to FIG. 1, the housing 12 may also support heat sinks 18. As shown in FIG. 4, a heat sink 18 may be connected to the housing 12 and thermally coupled to an associated receiver unit 14 by, for example, mechanical fasteners 28, such as self-tapping screws. While only two heat sinks can be seen in FIG. 1, those skilled in the art will appreciate that each receiver unit 14 may include an associated heat sink 18. Therefore, the number of heat sinks 18 associated with the receiver assembly 10 may depend on the number of receiver units 14 included in the receiver assembly 10.

Figure 2:
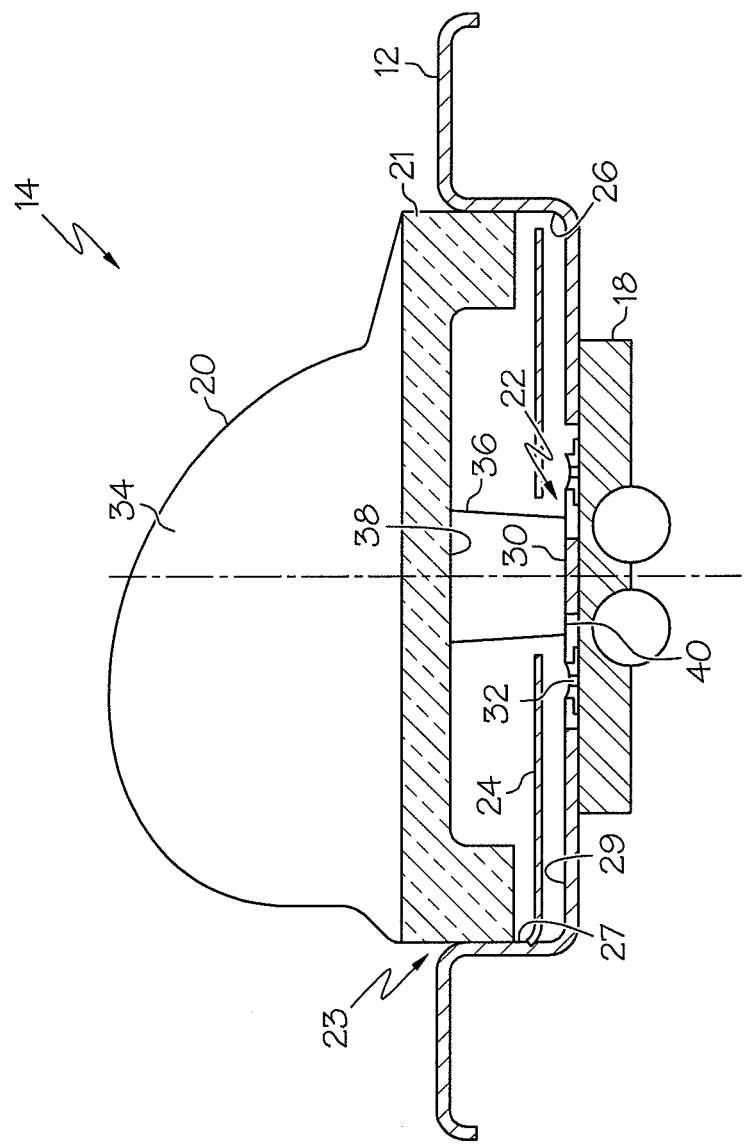
FIG. 2 is a side elevational view, in section, of a receiver unit of the solar receiver assembly of FIG. 1.

Referring to FIG. 2, each receiver unit 14 may include an optical element 20, a cell assembly 22 and a light shield 24, and may be received, at least partially, within an associated recess 26 defined by the housing 12. In one aspect, the recess 26 may be integrally formed in the housing 12, as shown in FIG. 2. In another aspect, the recess 26 may be formed by securing various parts to the housing 12.

The recess 26 is shown in FIG. 2 as a generally cylindrical (i.e., circular in top view) recess having a side wall 27 and a base 29. However, those skilled in the art will appreciate that the recess 26 may be shaped in various ways to receive the cell assembly 22 therein. Therefore, those skilled in the art will appreciate that the size and shape of the recess 26 may be dictated by the size and shape of the associated cell assembly 22 and optical element 20.

Referring to FIG. 4, the cell assembly 22 may be secured in the recess 26 using a adhesive, such as 1-4173 thermally conductive adhesive available from Dow Corning of Midland, Mich. However, those skilled in the art will appreciate that various techniques (e.g., mechanical fasteners) may be used to secure the cell assembly 22 in the recess 26 of the housing 12 without departing from the scope of the present disclosure.

Still referring to FIG. 4, the cell assembly 22 may include one or more solar cells 30 and at least one other component.

The other components of the cell assembly 22 may be electrical components 32, such as insulated wires and bypass diodes, or mechanical components (not shown), such as adhesives and fasteners.

Referring to FIG. 2, the optical element 20 may be positioned, at least partially, within the recess 26 to concentrate incoming light onto the solar cell 30 of the cell assembly 22. For example, the optical element 20 may be a refractive lens and may be formed from glass or a similar material. At this point, those skilled in the art will appreciate that the optical element 20 may be a secondary optical element, wherein the light coming into the optical element 20 may be light that has first been concentrated by a primary optical element (not shown).

The optical element 20 may be secured relative to the housing 12. For example, a sealant (not shown) may be applied around the interface 23 between the base 21 of the optical element 20 and the housing 12. To avoid potential damage resulting from the differences in the coefficients of thermal expansion, hard contact between the base 21 and the housing 12 at more than one point may be avoided. Of course, those skilled in the art will appreciate that various techniques and devices may be used to secured the optical element relative to the housing 12.

In one aspect, the optical element 20 may include a body 34 and a guide 36. The body 34 and the guide 36 may be integral (i.e., a single monolithic body of glass). The guide 36 may include a proximal end 38 and a distal end 40. The proximal end 38 may be coupled to the body 34 of the optical element 20 and the distal end 40 may extend through the light shield 24 (discussed below) and may be aligned with the solar cell 30 of the cell assembly 22. In one particular aspect, the distal end 40 of the guide 36 may be directly in contact with the solar cell 30. In another particular aspect, the distal end 40 of the guide 36 may be connected to the solar cell 30 using a tape or adhesive, such as an optical tape available from 3M Company of St. Paul, Minn. or LS-6140 optical adhesive available from NuSil Technology of Wareham, Mass. Therefore, light entering the optical element 20 is directed from the body 34 to the guide 36 and, ultimately, to the solar cell 30.

Figure 5:
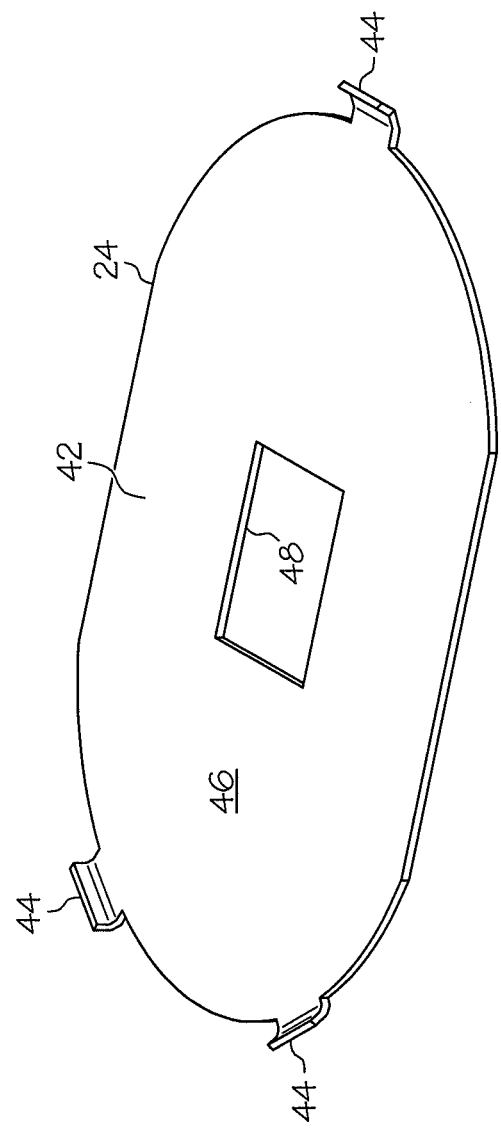
FIG. 5 is a front perspective view of the light shield shown in FIG. 3.

Referring to FIG. 5, the light shield 24 may include a body 42 and a plurality of tabs 44 extending outward from the body 42. Therefore, the light shield 24 may be quickly and easily manufactured on a large scale. For example, the light shield 24 may be mass produced using a stamping or press forming technique.

In one aspect, the light shield 24 may be formed from a material that is resistant and/or reflective of light. For example, the light shield 24 may be formed from aluminum or an aluminum alloy. In another aspect, the upper surface 46 of the light shield 24 may be coated with a light resistant and/or light reflective material. For example, the light shield 24 may be formed from a metal that has been coated with aluminum.

Figure 3:
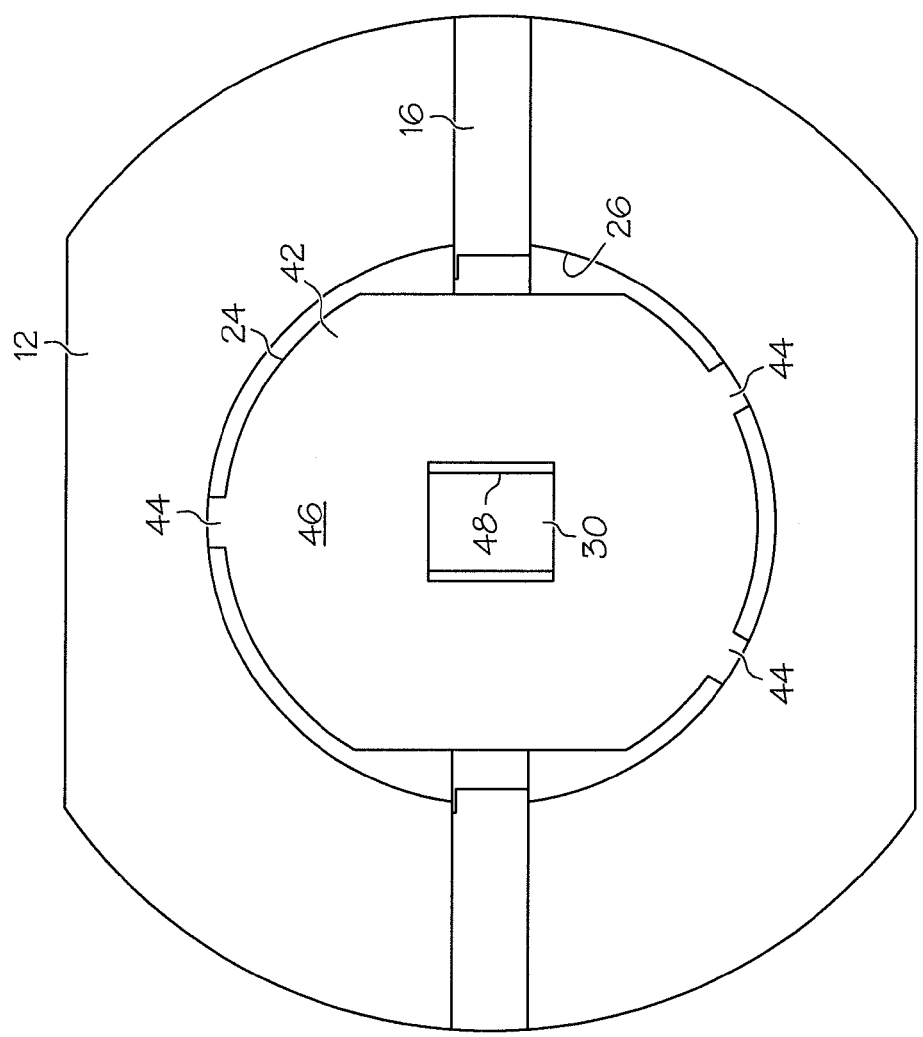
FIG. 3 is a top plan view of the receiver unit of FIG. 2, shown with the optical element removed.

Referring to FIG. 3, the body 42 of the light shield 24 may be a generally flat and planar sheet, and may be sized and shaped to be received in the recess 26 to cover the cell assembly 22. For example, when the recess 26 is generally cylindrical, the body 42 of the light shield 24 may be generally circular in top view, as shown in FIG. 3. The cross-sectional thickness (shown in FIG. 2) of the light shield 24 may be sufficient to shield incoming light and to provide the light shield 24 with sufficient structural rigidity. Therefore, the cross-section thickness of the light shield 24 may depend on the type of material from which the light shield 24 is formed.

The body 42 of the light shield 24 may define a window 48 therein. The window 48 may be positioned in the body 42 such that the window 48 is aligned with the solar cell 30 when the light shield 24 is positioned in the recess 26. Furthermore, the window 48 of the light shield 24 may be sized and shaped to closely correspond to the size and shape of the solar cell 30. For example, when the solar cell 30 is generally rectangular in top view, the window 48 may be generally rectangular in top view, as shown in FIG. 3.

In one aspect, the dimensions (e.g., length and width) of the window 48 may be substantially the same as the dimensions of the solar cell 30. In another aspect, the dimensions of the window 48 may be at most about 5 percent greater than the dimensions of the solar cell 30. In yet another aspect, the dimensions of the window 48 may be at most about 10 percent greater than the dimensions of the solar cell 30. Those skilled in the art will appreciate that the closer the size and shape of the window 48 corresponds to the size and shape of the solar cell 30, the less likely the other components 32 (FIG. 4) of the cell assembly 22 are to be exposed to concentrated solar energy.

The tabs 44 may extend sufficiently outward from the body 42 to form an interference fit between the recess 26 and the body 42 when the light shield 24 is pressed into the recess 26, as shown in FIG. 3. In one aspect, the tabs 44 may be generally co-planar with the body 42 prior to insertion of the light shield 24 into the recess 26. In another aspect, shown in FIG. 5, the tabs 44 may be pre-bent prior to insertion of the light shield 24 into the recess 26. For example, the tabs 44 may be pre-bent about 60 degrees from the plane defined by the body 42.

As shown in FIGS. 3 and 5, the tabs 44 may be generally rectangular tabs. However, those skilled in the art will appreciate that the size and shape of the tabs 44 may vary without departing from the scope of the present disclosure. For example, the tabs 44 may be pointed or rounded and still create the desired interference fit with the recess 26.

Furthermore, those skilled in the art will appreciate that the number of tabs 44 and the spacing of the tabs 44 about the body 42 may depend on the size and shape of the recess 26 and may be modified without departing from the scope of the present disclosure.

Figure 6:
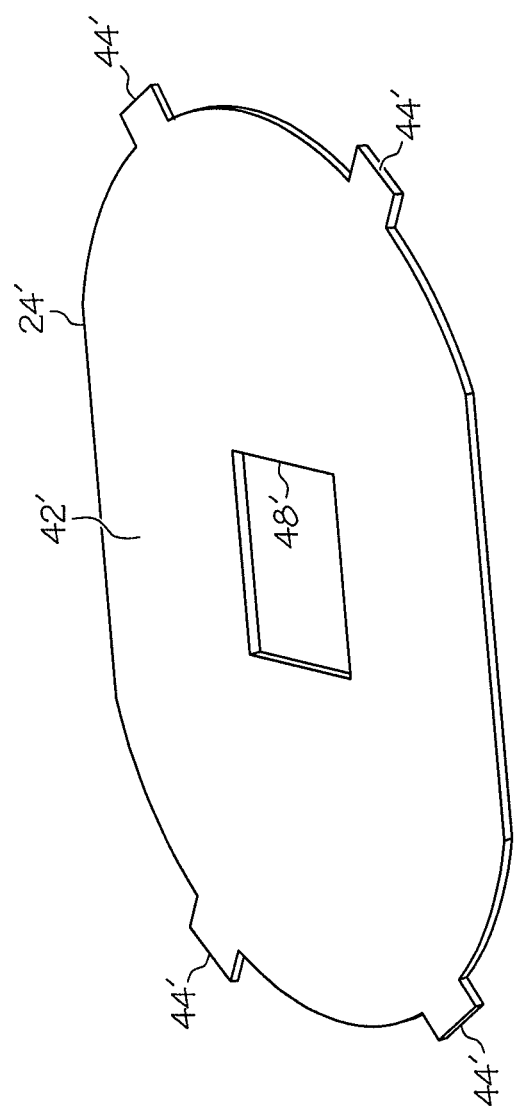
FIG. 6 is a front perspective view of an alternative aspect of the disclosed light shield.

Referring to FIG. 6, in an alternative aspect, the light shield 24' may include a body 42' and four tabs 44' spaced about a body 42', wherein the body 42' defines a window 48' therein. In one particular alternative aspect, the four tabs 44' may be spaced generally symmetrically about the body 42', thereby being less susceptible to uneven installation forces.

In one exemplary aspect, the receiver unit 14 shown in FIG. 2 may be assembled in a series of steps. First, as shown in FIG. 4, the cell assembly 22 may be secured into the recess 26 of the housing 12. Second, as shown in FIG. 3, the light shield 24 may be urged into the recess 26 such that the window 48 in the body 42 of the light shield 24 is aligned with the solar cell 30 of the cell assembly 22. The interference fit between the tabs 44 and the recess 26 may secure the light shield 24 within the recess 26. Finally, as shown in FIG. 2, the optical element 20 may be secured relative to the housing 12 such that the guide 36 extends through the window 48 in the light shield 24 and is aligned with the solar cell 30.

Accordingly, the disclosed light shield 24 provides an easy and low cost way of limiting damage and degradation of the cell assembly 22 due to off-point concentrated solar energy. Specifically, the disclosed light shield 24 may be low cost in that it may be formed from aluminum using a press forming process. Furthermore, the disclosed light shield 24 may reduce assembly time since it is held within the recess 26 by an interference fit (i.e., no need to install additional mechanical fasteners).

Although various aspects of the disclosed light shield for solar concentrators have been shown and described, modifications may occur to those skilled in the art upon reading the specification. The present application includes such modifications and is limited only by the scope of the claims.

What is claimed is:

1. A solar receiver unit comprising:
   a housing having a cylindrical sidewall and a base connected to define a recess;
   a cell assembly positioned on said base of said housing, said cell assembly including a solar cell;
   an optical element having a body, a cylindrical base, and a guide having a proximal end coupled to said optical element body and a distal end directly in contact with said solar cell, said cylindrical base of said optical element being mounted within said recess and secured to said cylindrical sidewall of said housing by a sealant applied around an interface between said cylindrical base of said optical element and said cylindrical sidewall of said housing, and a proximal end of said guide is coupled to said base of said optical element such that said guide extends downwardly from said cylindrical base of said optical element and is and aligned with said solar cell; and
   a light shield positioned in said recess between said optical element base and said solar cell and spaced from said base of said optical element and said base of said housing, said light shield consisting of a body made of a flat and planar sheet having a window therein shaped to receive said guide therethrough such that said body of said light shield is spaced from said guide, and a plurality of tabs extending outward from said light shield body and being directly in contact with said sidewall, said tabs being shaped to form an interference fit between said light shield body and said sidewall to support said light shield above said housing base,
   wherein said window is aligned with said solar cell.

2. The solar receiver unit of claim 1, wherein said light shield is formed from aluminum or an aluminum alloy.

3. The solar receiver unit of claim 1, wherein said solar cell has a first shape and size and said window has a second shape and size, said second shape and size being one of at most 5 percent greater, at most 10 percent greater, and the same as said first shape and size.

4. The solar receiver unit of claim 1, wherein said optical element body and said guide are a single monolithic body of glass.

5. The solar receiver unit of claim 1, wherein said cell assembly further includes at least one other component, said other component being displaced from said window.

6. The solar receiver unit of claim 1, wherein said light shield includes four of said tabs, said four tabs being symmetrically spaced about said body of said light shield.

7. The solar receiver unit of claim 1, wherein said tabs extend at an angle relative to said flat and planar sheet of said body.

8. The solar receiver unit of claim 7, wherein said angle is about 60 degrees.

9. The solar receiver unit of claim 1, further comprising a heat sink thermally coupled to said cell assembly.

10. A solar receiver unit comprising:
    a housing having a cylindrical sidewall and a base defining a recess;
    a cell assembly mounted on said housing base in said recess, said cell assembly including a solar cell;
    a light shield received in said recess, said light shield consisting of a body made of a flat and planar sheet having a window therein, and a plurality of tabs, said tabs extending outward from said light shield body and being shaped to contact said sidewall to form an interference fit between said light shield body and said sidewall to support said light shield above said housing base in a flat and planar configuration; and
    an optical element having a body with a cylindrical base secured to said cylindrical sidewall by a sealant applied around an interface between said cylindrical base of said optical element and said cylindrical sidewall of said housing and positioned above and spaced from said light shield such that said light shield is disposed between said cell assembly and said cylindrical base of said optical element, said optical element having a guide coupled to said body with a proximal end attached to said base of said optical element and extending downwardly from said cylindrical base of said optical element through said window and a distal end directly in contact with said solar cell, wherein said guide is spaced from said light shield, and is aligned with said solar cell.

11. The solar receiver unit of claim 10, wherein said light shield is formed from aluminum or an aluminum alloy.

12. The solar receiver unit of claim 10, wherein said solar cell has a first shape and size and said window has a second shape and size, said second shape and size being one of at most 5 percent greater, at most 10 percent greater, and the same as said first shape and size.

13. The solar receiver unit of claim 10, wherein said optical element body and said guide are a single monolithic body of glass.

14. The solar receiver unit of claim 10, wherein said light shield includes four of said tabs, said four tabs being symmetrically spaced about said body.

15. The solar receiver unit of claim 10, wherein at least one of said tabs extends at an angle relative to said flat and planar sheet.

16. The solar receiver unit of claim 10, further comprising a heat sink thermally coupled to said cell assembly.

17. The solar receiver unit of claim 1, wherein said body of said optical element and said guide are a single monolithic body.

18. The solar receiver unit of claim 10, wherein said body of said optical element and said guide are a single monolithic body.

* * * * *